United States Patent
Kang et al.

(10) Patent No.: US 10,734,392 B2
(45) Date of Patent: *Aug. 4, 2020

(54) RESISTIVE MEMORY DEVICE INCLUDING FERROELECTRICS AND METHOD OF MANUFACTURING THE SAME

(71) Applicant: SK hynix Inc., Gyeonggi-do (KR)

(72) Inventors: Se Hun Kang, Gyeonggi-do (KR); Deok Sin Kil, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,529

(22) Filed: Nov. 21, 2018

(65) Prior Publication Data

US 2019/0109279 A1    Apr. 11, 2019

Related U.S. Application Data

(63) Continuation of application No. 15/213,600, filed on Jul. 19, 2016, now abandoned.

(30) Foreign Application Priority Data

Feb. 26, 2016    (KR) .................. 10-2016-0023560

(51) Int. Cl.
*H01L 27/115* (2017.01)
*G11C 11/22* (2006.01)
*H01L 49/02* (2006.01)

(52) U.S. Cl.
CPC .......... *H01L 27/115* (2013.01); *G11C 11/22* (2013.01); *H01L 28/00* (2013.01); *G11C 11/223* (2013.01)

(58) Field of Classification Search
None
See application file for complete search history.

(56) References Cited

U.S. PATENT DOCUMENTS

2007/0120182 A1* 5/2007 Rouh ............... H01L 21/28061
                                                        257/330
2014/0138753 A1* 5/2014 Ramaswamy .... H01L 29/40111
                                                        257/295

* cited by examiner

*Primary Examiner* — Vincent Wall
(74) *Attorney, Agent, or Firm* — IP & T Group LLP

(57) ABSTRACT

A non-volatile memory device may include a semiconductor substrate, a ferroelectric layer, a source, a drain, a gate and a channel region. The semiconductor substrate may have a recess. The ferroelectric layer may be formed in the recess. The source may be arranged at a first side of the recess. The drain may be arranged at a second side of the recess opposite to the first side. The gate may be arranged on the ferroelectric layers. The channel region may be formed on the recess between the source and the drain.

8 Claims, 4 Drawing Sheets

RESISTIVE MEMORY DEVICE INCLUDING FERROELECTRICS AND METHOD OF MANUFACTURING THE SAME

CROSS-REFERENCES TO RELATED APPLICATION

This application is a continuation of U.S. patent application Ser. No. 15/213,600 filed on Jul. 19, 2016, which claims priority under 35 U.S.C. § 119(a) to Korean application number 10-2016-0023560 filed on Feb. 26, 2016 in the Korean Intellectual Property Office. The disclosure of each of the foregoing application is incorporated herein by reference in its entirety.

BACKGROUND

1. Technical Field

Various embodiments generally relate to a non-volatile memory device and a method of manufacturing the same, more particularly, to a non-volatile memory device including ferroelectrics and a method of manufacturing the non-volatile memory device.

2. Related Art

A semiconductor memory device may be classified into a volatile memory device and a non-volatile memory device. The volatile memory device may have rapid read and write speeds. In contrast, when a power supply to the volatile memory device interrupts, data in the volatile memory device may be erased. The non-volatile memory device may store data regardless of a power supply. Thus, the non-volatile memory device may be advantageous in storing data regardless of the power supply.

Recently, the non-volatile memory device having a high integration degree and a massive storage capacity may be widely used. The non-volatile memory device may include a flash memory device used in portable electronic devices. However, a non-volatile memory device having improved operational capacity to which a random access may be applied may also be widely developed. For example, this non-volatile memory device may include a ferroelectric RAM (FeRAM) using a ferroelectric capacitor, a magnetic RAM (MRAM) using a tunneling magneto-resistive (TMR) layer, a phase-changeable memory device using chalcogenide alloys, a resistive RAM (ReRAM) using a resistive layer as a data storage medium, etc.

The FeRAM may use a ferroelectric material as a storage medium. The ferroelectric material may have a spontaneous polarization characteristic. A spontaneous polarization direction of the ferroelectric material may be controlled by an electric field. When a voltage or an electric field is applied to the ferroelectric material, the ferroelectric material may be polarized in accordance with the spontaneous polarization characteristic so that the FeRAM may perform memory operations.

The ferroelectric memory device may use the ferroelectric layer as a gate insulating layer. However, as the semiconductor memory device may have been highly integrated, it may be difficult to screen surface charges on the ferroelectric layer due to a narrow line width of the gate.

SUMMARY

According to an embodiment, there may be provided a non-volatile memory device. The non-volatile memory device may include a semiconductor substrate, a ferroelectric layer, a source, a drain, a gate and a channel region. The semiconductor substrate may have a recess. The ferroelectric layer may be formed in the recess. The source may be arranged at a first side of the recess. The drain may be arranged at a second side of the recess. The second side is located opposite to the first side with respect to the recess. The gate may be arranged over the ferroelectric layers. The channel region may be formed in the semiconductor substrate along a contour recess and between the source and the drain.

According to an embodiment, there may be provided a non-volatile memory device. The non-volatile memory device may include a semiconductor substrate, a storage member, a source, a drain and a gate. The storage member may be formed in the semiconductor substrate. The source and the drain may be formed in the semiconductor substrate at both sides of the storage member. The gate may be formed over the storage member. The storage member has different polarization states depending on by an electric field level which applied to the gate to the storage member.

According to an embodiment, there may be provided a method of manufacturing a non-volatile memory device. In the method of manufacturing the non-volatile memory device, impurities may be implanted into a semiconductor substrate. The semiconductor substrate may be etched to form a recess, thereby defining a source and a drain doped with the impurities. A ferroelectric layer may be formed in the recess. A gate may be formed on the ferroelectric layer.

According to an embodiment, there may be provided a non-volatile memory device. The non-volatile memory device may include a source, a drain, a ferroelectric layer and a gate. The source and drain is located at a first level. The ferroelectric layer is extending from between the source and the drain to a second level. The second level is lower than the first level. The gate is provided over the ferroelectric layer and between the source and the drain.

DETAILED DESCRIPTION

Figure 1:
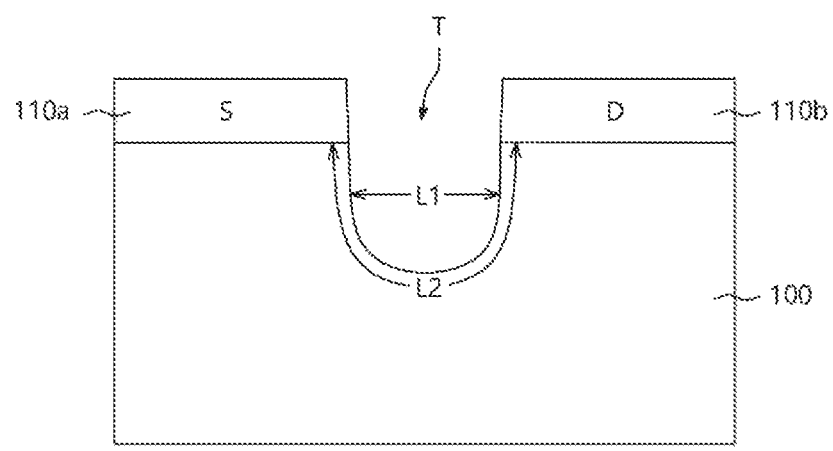
FIGS. 1 to 4 are cross-sectional views illustrating a method of manufacturing a non-volatile memory device in accordance with an embodiment.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented for example, rotated 90 degrees or at other orientations, and the spatially relative descriptors used herein should be interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms, including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be described with reference to the accompanying drawings.

FIGS. 1 to 4 are cross-sectional views illustrating a method of manufacturing a non-volatile memory device in accordance with an embodiment. Referring to FIG. 1, a semiconductor substrate 100 may be prepared. The semiconductor substrate 100 may include a semiconductor material such as Si, SiGe, etc. Impurities may be implanted into the semiconductor substrate 100 to form impurity regions such as a source and a drain. The impurity regions may include N type impurities having a high concentration such as P (phosphorus), As (arsenic), etc. Alternatively, when a PMOS transistor may be formed, the impurity regions may include P type impurities such as B (boron), etc. Further, the impurities in the source may be contrary to the impurities in the drain.

Figure 6:
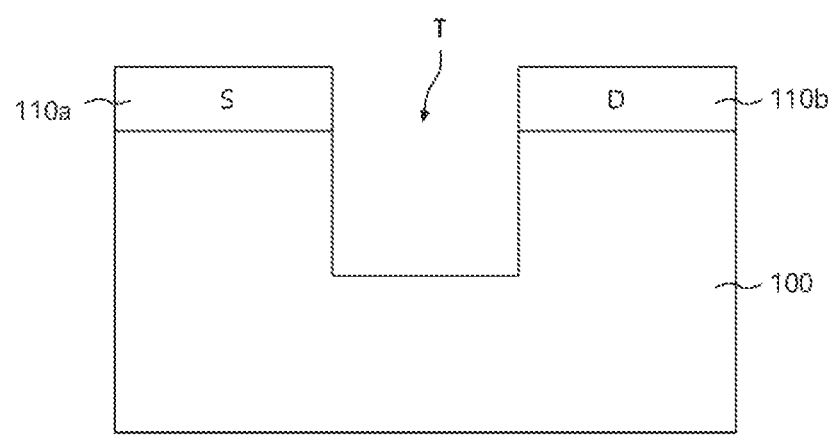

The semiconductor substrate 100 having the impurity regions may be etched to form a recess T. The impurity regions may be divided into a source 110a and a drain 110b by the recess T. A channel region between the source 110a and the drain 110b may have a length L2 longer than a length L1 of a channel region in a planar type non-volatile memory device. The recess T may be formed by an anisotropic etching process, an isotropic etching process, etc. For example, when the recess T may be formed by the isotropic etching process such as a wet etching process, the recess T may have a semi-spherical shape. In another embodiment, when the recess T may be formed by the anisotropic etching process as shown in FIG. 6, the recess T' may have a squared trench shape with a vertical sidewall.

Figure 2:
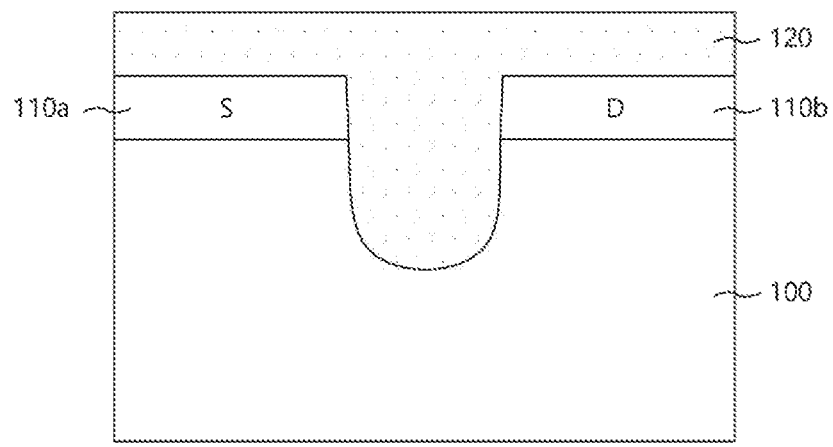

Referring to FIG. 2, a ferroelectric layer 120 may be formed on the semiconductor substrate 100 to fill up the recess T. The ferroelectric layer 120 may include a dielectric material capable of showing switchable polarizations upon application of an external electric field. For example, the polarized ferroelectric layer 120 may generate displacement of contrarily charged ions and dipole moments.

The ferroelectric layer 120 may include a hafnium oxide ($Hf_xO_y$) layer where each of x and y is a positive integer. The ferroelectric layer 120 may include additional dielectric materials capable of being polarized by the electric field applied to an electrode, for example, a gate.

Additionally, the ferroelectric layer 120 may maintain the polarization state after the electric field may be turned off. As a result, the polarization of the ferroelectric layer 120 may be interpreted as states of a memory cell, for example 1 or 0.

The polarization of the ferroelectric layer 120 may be determined by measuring a specific resistance of a ferroelectric memory device such as a ferroelectric MOS transistor. The specific resistance may be dependent upon the polarization of the ferroelectric layer 120. The polarization of the ferroelectric layer 120 may be sensed by measuring a voltage flowing through the ferroelectric MOS transistor when a low bias is applied. Furthermore, since the ferroelectric layer 120 may maintain its polarization state even when a power supply interrupts, the ferroelectric layer 120 may be used as a non-volatile storage medium such as a cell capacitor. The ferroelectric layer 120 may not require a refresh operation, unlike a DRAM.

Figure 3:
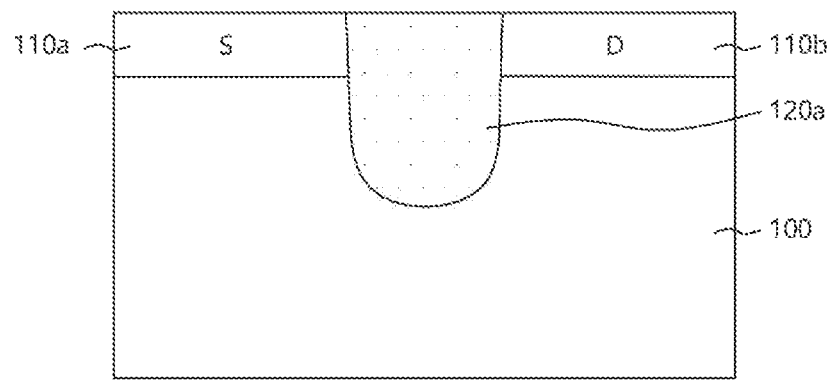
Figure 4:
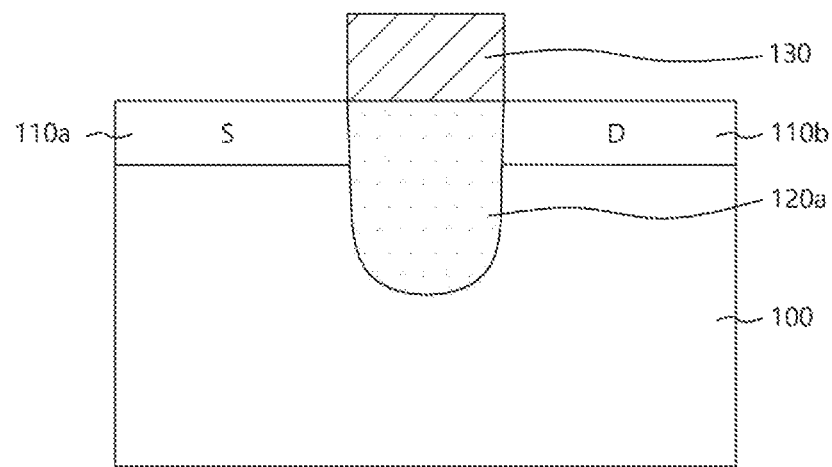

Referring to FIG. 3, the ferroelectric layer 120 may be planarized until an upper surface of the semiconductor substrate 100 may be exposed to form the planarized ferroelectric layer 120 in the recess T. The ferroelectric layer 120 may be planarized by an etch stop process having an etching end point such as the upper surface of the semiconductor substrate 100. The channel region may have the length L2 and is formed under the ferroelectric layer 120. Referring to FIG. 4, a conductive layer may be formed on the semiconductor substrate 100. The conductive layer may be patterned to form a gate 130 on the ferroelectric layer 120. The gate 130 may include a metal layer.

The gate 130 may be electrically isolated from the source 110a and the drain 110b.

The ferroelectric memory device may include one ferroelectric MOS transistor. The ferroelectric MOS transistor may perform operations of a transistor. Furthermore, the ferroelectric MOS transistor may store data '0' or '1' by changing its polarization state in accordance with the electric field applied to the ferroelectric layer 120.

The ferroelectric layer 120 may be formed in the recess T of the semiconductor substrate 100. Since the channel region is formed along a bottom surface of the recess T and between the source 110a and the drain 110b, the channel region may have the length longer than the length of the planar type MOS transistor. That is, a contact area between the ferroelectric layer 120 and the channel region may be remarkably increased by the recess T so that a sufficient amount of charges may be arranged on an interface between the ferroelectric layer 120 and the channel region. As a result, a depolarization may be reduced by decreasing a screening.

Figure 5:
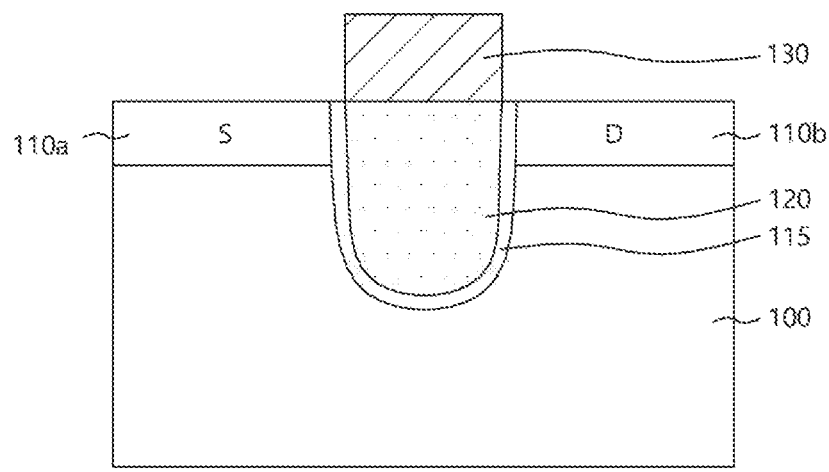
FIGS. 5 and 6 are cross-sectional views illustrating a non-volatile memory device in accordance with an embodiment.

As shown in FIG. 5, a process for forming a gate insulating layer 115 may be performed between the process for forming the recess T and the process for forming the ferroelectric layer 120. The gate insulating layer 115 may be interposed between the semiconductor substrate 100 and the ferroelectric layer 120 to improve interfacial characteristics and insulation characteristics between the gate 130 and the source/drain 110a and 110b.

Figure 7:
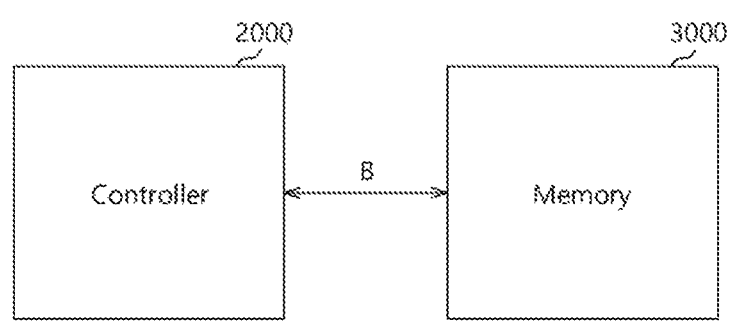
FIG. 7 is a schematic diagram illustrating a memory system according to an embodiment.

FIG. 7 is a schematic diagram illustrating a memory system according to an embodiment. Referring to FIG. 7, a memory system 1000 may include a memory controller 2000 and a memory 3000. The memory 3000 may communicate with the memory controller 2000 through a bus line B. The bus line B may include a bus for transmitting addresses, data, commands, etc.

The memory 3000 may include the ferroelectric memory device of example embodiments. The ferroelectric memory device may include the ferroelectric layer formed in the semiconductor substrate. Since the ferroelectric layer may be formed in the recess of the semiconductor substrate, the channel region may have a long length so that a charge amount between the ferroelectric layer and the channel region may increase. The ferroelectric memory device may be applied to a switching device as well as a memory device.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A resistive memory device, comprising:
   a semiconductor substrate having a trench with a depth;
   a gate insulating layer that lines the walls of the trench;
   a ferroelectric layer formed to fill the remaining entire space of the trench, as a storage member;
   a gate formed on the ferroelectric layer including an upper surface and a bottom surface;
   a source formed in the semiconductor substrate corresponding to a first side of the ferroelectric layer; and
   a drain formed in the semiconductor substrate corresponding to a second side of the ferroelectric layer,
   wherein an upper surface of the ferroelectric layer, upper surfaces of the source and drain, the upper surface of the gate insulating layer, and the bottom surface of the gate are coplanar.

2. The resistive memory device of claim 1, wherein a channel region between the source and drain is formed in the semiconductor substrate along a contour of the trench.

3. The resistive memory device of claim 1, wherein the ferroelectric layer is a single layer.

4. The resistive memory device of claim 1, wherein depths of the source or the drain are shallower than a depth of the ferroelectric layer.

5. The resistive memory device of claim 1, wherein the gate is electrically isolated from the source and drain.

6. The resistive memory device of claim 1, wherein the upper surface of the gate, and the bottom surface of the gate are flat and parallel to each other.

7. The resistive memory device of claim 1, wherein a whole upper surface of the ferroelectric layer is contacted with a whole bottom surface of the gate positioned on the semiconductor.

8. A resistive memory device, comprising:
   a semiconductor substrate having a trench with a depth;
   a ferroelectric layer formed to fill the entire space of the trench;
   a gate formed on the ferroelectric layer including an upper surface and a bottom surface;
   a source formed in the semiconductor substrate corresponding to a first side of the ferroelectric layer; and
   a drain formed in the semiconductor substrate corresponding to a second side of the ferroelectric layer,
   wherein an upper surface of the ferroelectric layer, upper surfaces of the source and drain, and the bottom surface of the gate are coplanar.

* * * * *